United States Patent
Kato et al.

(10) Patent No.: US 10,818,565 B2
(45) Date of Patent: Oct. 27, 2020

(54) CIRCUIT BOARD AND SEMICONDUCTOR MODULE

(71) Applicants: Kabushiki Kaisha Toshiba, Tokyo (JP); Toshiba Materials Co., Ltd., Yokohama-shi Kanagawa (JP)

(72) Inventors: Hiromasa Kato, Nagareyama Chiba (JP); Takashi Sano, Fujisawa Kanagawa (JP)

(73) Assignees: KABUSHIKI KAISHA TOSHIBA, Tokyo (JP); TOSHIBA MATERIALS CO., LTD., Yokohama-Shi, Kanagawa-Ken (JP)

( * ) Notice: Subject to any disclaimer, the term of this patent is extended or adjusted under 35 U.S.C. 154(b) by 0 days.

(21) Appl. No.: 16/258,288

(22) Filed: Jan. 25, 2019

(65) Prior Publication Data

US 2019/0172765 A1   Jun. 6, 2019

Related U.S. Application Data

(63) Continuation of application No. PCT/JP2017/027241, filed on Jul. 27, 2017.

(30) Foreign Application Priority Data

Jul. 28, 2016 (JP) ................................. 2016-148106

(51) Int. Cl.
*H01L 23/15* (2006.01)
*H01L 23/36* (2006.01)
(Continued)

(52) U.S. Cl.
CPC ............ *H01L 23/15* (2013.01); *B23K 1/0016* (2013.01); *H01L 23/13* (2013.01); *H01L 23/36* (2013.01);
(Continued)

(58) Field of Classification Search
CPC .......................... H01L 23/49861; H01L 23/15
See application file for complete search history.

(56) References Cited

U.S. PATENT DOCUMENTS

| 5,621,243 A | 4/1997 | Baba et al. |
| 2006/0157862 A1* | 7/2006 | Nishimura .......... H01L 23/3735 257/772 |

(Continued)

FOREIGN PATENT DOCUMENTS

| EP | 0661748 A1 | 7/1995 |
| EP | 3031789 A1 | 6/2016 |

(Continued)

*Primary Examiner* — Alia Sabur
(74) *Attorney, Agent, or Firm* — Harness, Dickey & Pierce, P.L.C.

(57) ABSTRACT

A circuit board includes: a ceramic substrate that has a first surface and a second surface; a first metal part that has a first metal plate joined to the first surface and a protrusion projecting from a front surface of the first metal plate; and a second metal part that has a second metal plate joined to the second surface. When the ceramic substrate is equally divided into first to third sections along a longer side direction, $V_1$, $V_2$, $V_3$, $V_4$, $V_5$, and $V_6$ are numbers satisfying formula $V_4/V_1+V_6/V_3 \leq 2(V_5/V_2)$, $0.5 \leq V_4/V_1 \leq 2$, $0.5 \leq V_5/V_2 \leq 2$, and $0.5 \leq V_6/V_3 \leq 2$.

12 Claims, 5 Drawing Sheets

(51) Int. Cl.
  *H01L 23/13*   (2006.01)
  *B23K 1/00*    (2006.01)
  *H01L 23/367*  (2006.01)
  *H01L 23/373*  (2006.01)
  *H05K 1/02*    (2006.01)
  *H05K 1/03*    (2006.01)
  *H05K 3/20*    (2006.01)

(52) U.S. Cl.
  CPC ...... *H01L 23/3675* (2013.01); *H01L 23/3735* (2013.01); *H05K 1/0201* (2013.01); *H05K 1/0306* (2013.01); *H05K 3/202* (2013.01)

(56) References Cited

U.S. PATENT DOCUMENTS

| | | |
|---|---|---|
| 2012/0168209 A1 | 7/2012 | Kato |
| 2014/0291385 A1 | 10/2014 | Kato |
| 2014/0291699 A1* | 10/2014 | Yano .................... C04B 37/026 257/77 |
| 2016/0315023 A1* | 10/2016 | Yoshida ................ H01L 23/053 |
| 2018/0102303 A1* | 4/2018 | Mori ........................ B32B 3/30 |

FOREIGN PATENT DOCUMENTS

| | | | |
|---|---|---|---|
| EP | 3306655 A1 | 4/2018 | |
| JP | 7-221265 | 8/1995 | |
| JP | 10-004156 A | 1/1998 | |
| JP | 2004-134703 A | 4/2004 | |
| JP | 2006245437 A | 9/2006 | |
| JP | 2007-299974 A | 11/2007 | |
| JP | 2010103311 A * | 5/2010 | ......... H01L 23/3735 |
| JP | 2011-091184 A | 5/2011 | |
| JP | 4893096 B2 * | 3/2012 | |
| WO | WO2011-034075 A1 | 2/2013 | |

* cited by examiner

CIRCUIT BOARD AND SEMICONDUCTOR MODULE

CROSS-REFERENCE TO RELATED APPLICATIONS

This application is a continuation of prior International Application No. PCT/JP2017/027241, filed on Jul. 27, 2017 which is based upon and claims the benefit of priority from Japanese Patent Application No. 2016-148106 filed on Jul. 28, 2016; the entire contents of the above applications are incorporated herein by reference.

FIELD

Embodiments described herein generally relate to a circuit board and a semiconductor module.

BACKGROUND

In recent years, with a performance improvement of industrial apparatuses, the outputs of power modules mounted thereon have been becoming higher. Accordingly, the outputs of semiconductor elements have been becoming higher. Operation guaranteed temperatures of semiconductor elements are 125° C. to 150° C., and it is expected that the operation guaranteed temperatures will increase to 175° C. or more in the future.

The increase in the operation guaranteed temperatures of semiconductor elements requires that ceramic metal circuit boards should have high thermal cycle test (TCT) characteristics. The TCT is a test to measure durability of a ceramic metal circuit board by setting low temperature room temperature high temperature room temperature as one cycle.

Examples of conventional ceramic metal circuit boards include a ceramic metal circuit board having a brazing material protruding portion having no void therein. An example using a silicon nitride substrate as a ceramic substrate has 5000 cycle-durability. By eliminating the void in the brazing material protruding portion, it is possible to improve the TCT characteristics. However, with the performance improvement of semiconductor elements, it is expected that the operation guaranteed temperatures will increase to 175° C. or more.

Meanwhile, with the performance improvement of semiconductor elements, studies are made on the use of a large external terminal in order to increase ampacity. The thickness of a joined portion of an external terminal is 3 mm or more, for example. External terminals include those having various shapes such as a lead frame and a lead pin. To increase the ampacity, using a relatively thick lead frame instead of a thin wire such as a bonding wire is effective.

It is also effective to thicken only a place of a metal plate where a semiconductor element is to be mounted and dissipate the heat of the element easily. The metal plate that has been thickened only in the place where a semiconductor element is to be mounted has a protrusion. By providing the protrusion on the metal plate as above, working the metal plate into a three-dimensional structure having a protrusion has been attempted in order to secure the ampacity and improve a heat dissipation property.

Providing the protrusion on the metal plate causes a ceramic circuit board to curve greatly. If the ceramic circuit board curves, poor mounting is likely to occur when it is mounted on a heat dissipation member. When the ceramic circuit board having a protrusion on a metal plate is subjected to a TCT whose temperature on the high-temperature side is 175° C., good characteristics are not necessarily obtained. This is because a higher stress is applied to the ceramic circuit board as the lead terminal or the metal plate is thicker. Under such circumstances, there is required a ceramic circuit board with good TCT characteristics that does not curve even when a protrusion is provided on a metal plate.

DETAILED DESCRIPTION

A circuit board according to an embodiment includes: a ceramic substrate that has a first surface and a second surface and has a thickness of 0.5 mm or less; a first metal part that has a first metal plate joined to the first surface and a protrusion projecting from a front surface of the first metal plate; and a second metal part that has a second metal plate joined to the second surface. A thickness of at least one of the first metal plate and the second metal plate is 0.6 mm or more. A ratio of the total volume of the first metal plate to the total volume of the second metal plate is larger than 1.0. When the ceramic substrate is equally divided into first to third sections along a longer side direction, the first metal part has a first region overlapping the first section, a second region overlapping the second section, and a third region overlapping the third section. The second metal part has a fourth region overlapping the first section, a fifth region overlapping the second section, and a sixth region overlapping the third section. A volume $V_1$ of the first region, a volume $V_2$ of the second region, a volume $V_3$ of the third region, a volume $V_4$ of the fourth region, a volume $V_5$ of the fifth region, and a volume $V_6$ of the sixth region are numbers satisfying formula $V_4/V_1 + V_6/V_3 \leq 2(V_5/V_2)$, $0.5 \leq V_4/V_1 \leq 2$, $0.5 \leq V_5/V_2 \leq 2$, and $0.5 \leq V_6/V_3 \leq 2$.

Figure 1:
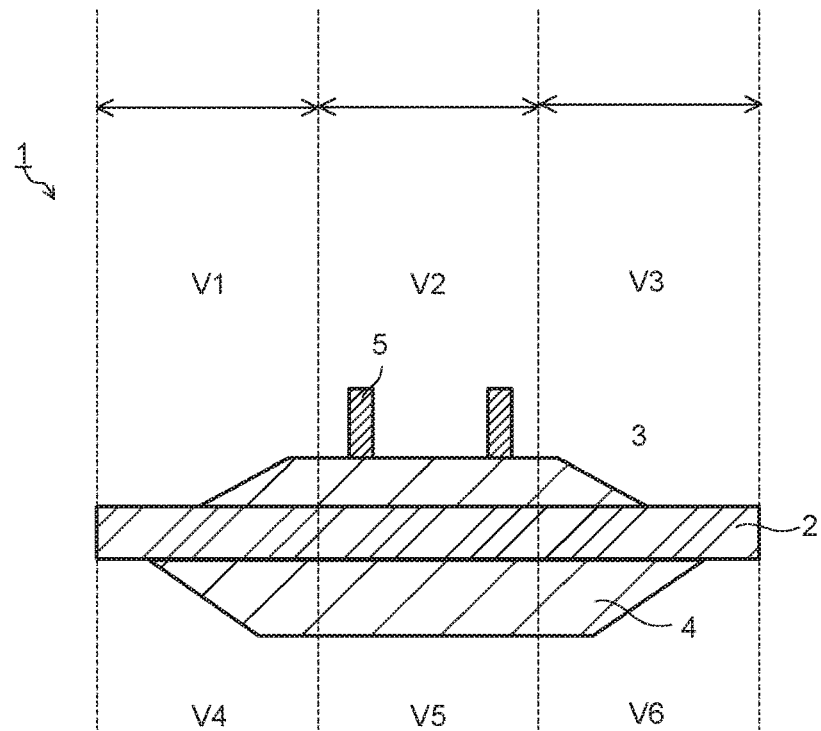
FIG. 1 is a view illustrating one example of a ceramic circuit board.
Figure 2:
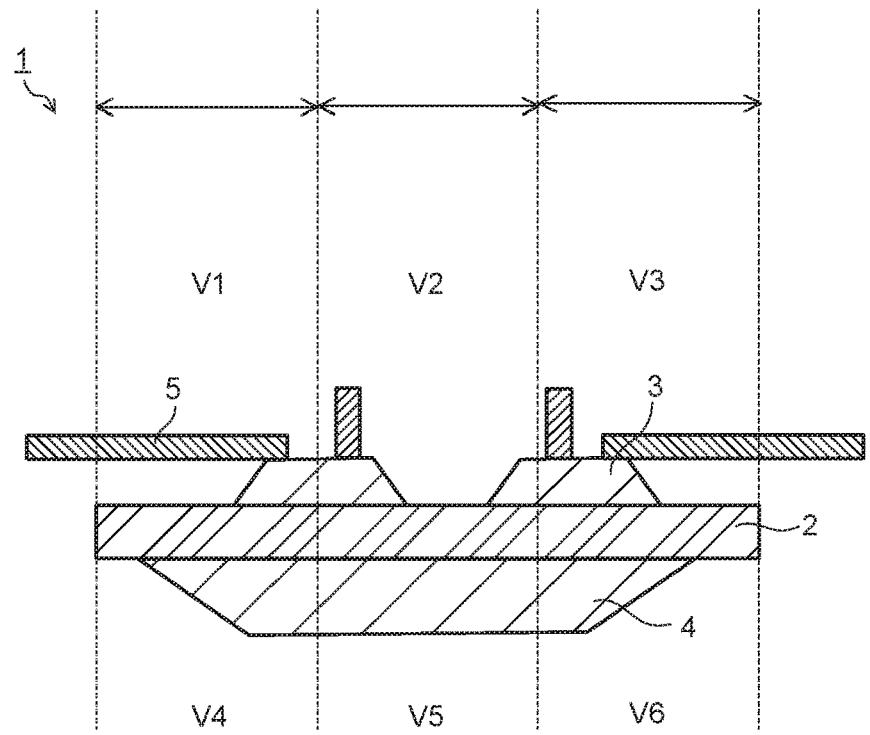
FIG. 2 is a view illustrating another one example of the ceramic circuit board.
Figure 3:
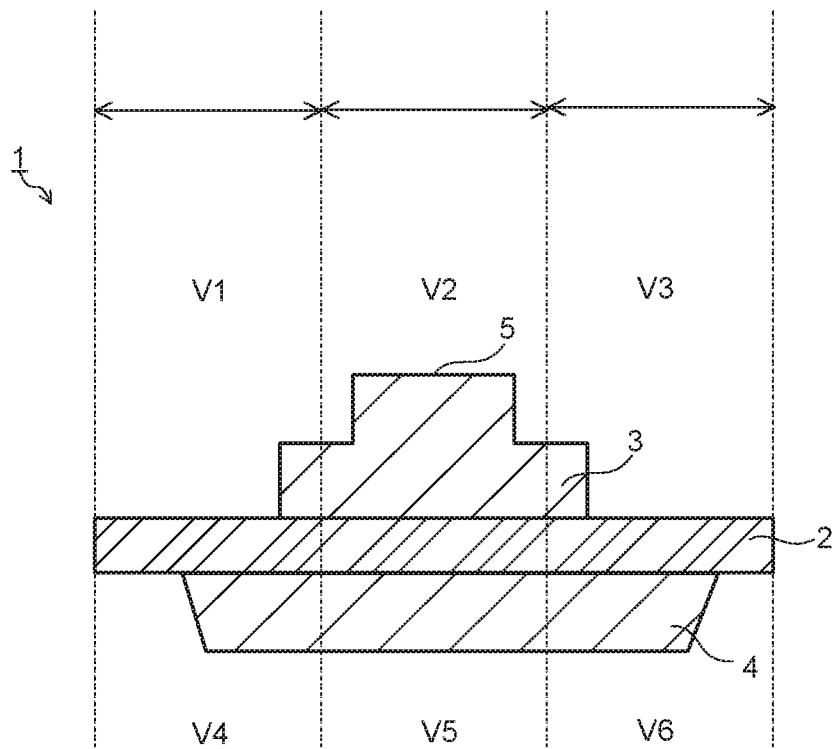
FIG. 3 is a view illustrating still another one example of the ceramic circuit board.

FIG. 1 to FIG. 3 each illustrate an example of a ceramic circuit board according to an embodiment. FIG. 1 to FIG. 3 each illustrate a ceramic circuit board 1, a ceramic substrate 2, a front metal plate 3, a rear metal plate 4, and a protrusion (an external terminal or a protrusion on the front metal plate 3) 5. In FIG. 1, lead pin type external terminals are joined to the front metal plate 3. In FIG. 2, lead pin type and lead frame type external terminals are connected to the front metal plate 3 to form the protrusion 5. In FIG. 2, two external terminals are joined to each of the two front metal plates 3 to form the protrusion 5. In FIG. 3, the front metal plate 3 having the protrusion 5 is joined to the ceramic substrate 2.

The thickness of the ceramic substrate 2 is preferred to be 0.50 mm or less. The case where the thickness of the ceramic substrate 2 exceeds 0.50 mm may decrease the heat dissipation property. As will be described later, it becomes difficult to control a warpage amount of the ceramic circuit board prior to joining to the external terminal.

The material of the ceramic substrate 2 is not limited in particular as long as its thickness is 0.50 mm or less. The ceramic substrate 2 is preferred to be a silicon nitride substrate whose thickness is 0.33 mm or less and whose three-point bending strength is 500 MPa or more. The silicon nitride substrate can be thinned down to 0.33 mm or less or further less than 0.30 mm. The ceramic substrate 2 is preferred to be a silicon nitride substrate whose heat conductivity is 80 W/m·K or more and whose three-point bending strength is 500 MPa or more. Thinning the ceramic substrate 2 makes it possible to improve the heat dissipation property. Increasing the heat conductivity makes it possible to further improve the heat dissipation property. The three-point bending strength is preferred to be 500 MPa or more or further 600 MPa or more. Increasing the strength of the substrate makes it possible to reduce the warpage amount even when the metal plate having the protrusion is joined as will be described later. The silicon nitride substrate is a substrate capable of achieving thinning, high heat conductivity, and high strength.

The thickness of at least one of the front metal plate 3 and the rear metal plate 4 is preferred to be 0.6 mm or more. The front metal plate 3 is a metal plate for joining an external terminal and a semiconductor element thereto. The rear metal plate 4 is used for being mounted on a heat dissipation member or the like. At least one of the front metal plate 3 and the rear metal plate 4 preferably contains copper, aluminum, or their alloy. Copper and aluminum each have good conductivity. The heat conductivity of copper and aluminum is high, the heat conductivity of copper is 398 W/m·K, and the heat conductivity of aluminum is 237 W/m·K. Therefore, it is possible to improve the heat dissipation property.

Figure 4:
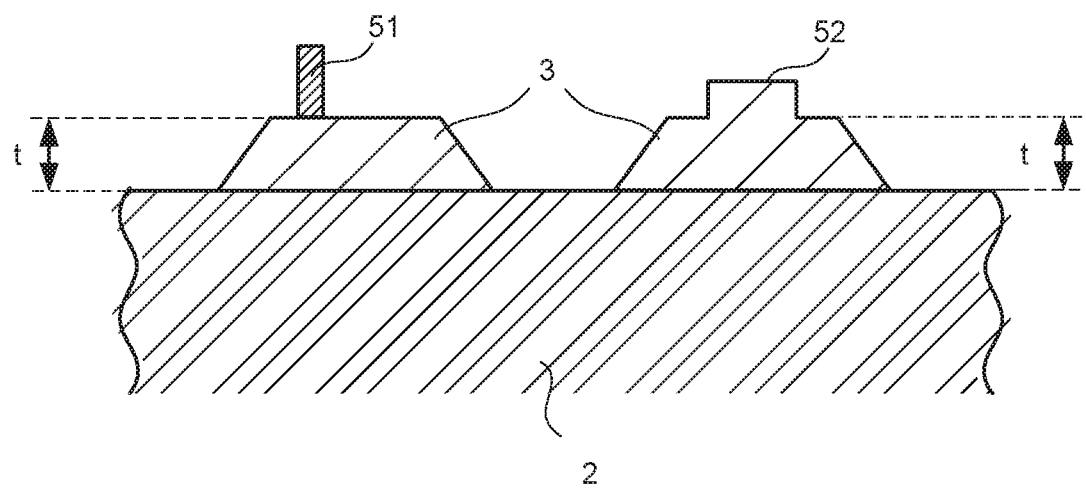
FIG. 4 is a view illustrating the thickness of a metal plate of the ceramic circuit board as an example.

FIG. 4 is a view illustrating a measurement reference of the thickness of the front metal plate 3 as an example. FIG. 4 illustrates the ceramic substrate 2, the front metal plates 3, a lead pin type external terminal 51, a protrusion 52, and a thickness t of the metal plate 3. As illustrated in FIG. 4, in the case of connecting the external terminal 51, the thickness of the front metal plate 3 prior to the external terminal 51 being connected thereto is defined as the thickness t of the front metal plate 3. In the case of the protrusion 52 being formed on the front metal plate 3, the thickness of a portion excluding the protrusion 52 is defined as the thickness t of the front metal plate 3. The thickness of the rear metal plate 4 is defined in the same manner.

Setting the thickness t of the metal plate (the front metal plate 3 and the rear metal plate 4) to 0.6 mm or more makes it possible to improve the heat dissipation property. The thickness t of the metal plate is preferred to be 0.6 mm or more or further 0.8 mm or more. The upper limit of the thickness t of the metal plate is not limited in particular, but is preferred to be 3 mm or less. The ceramic circuit board according to the embodiment has a structure having the protrusion on the front metal plate 3. The protrusion has a structure with the external terminal joined thereto or a structure with the protrusion provided on the metal plate. The front metal plate 3 is formed thick partially, and thus when the metal plate is too thick, it may become difficult to reduce the warpage amount of the ceramic substrate. Therefore, the thickness t of the metal plate is preferably 0.6 mm or more and 3 mm or less.

The ratio of the total volume of the rear metal plate 4 to the total volume of the front metal plate 3 (the total volume of the rear metal plate 4/the total volume of the front metal plate 3) is preferred to be larger than 1.0. That is, the ratio of the total volume of the rear metal plate 4 to the total volume of the front metal plate 3 is controlled. The number of the rear metal plate 4 and the number of the front metal plate 3 each may be one, or plural. When the total volume ratio of the front metal plate 3 is found, the protrusion is not counted. That is, the volume of the front metal plate 3 is found by totaling the volumes of the ranges of the thickness t.

The fact that the total volume of the rear metal plate 4/the total volume of the front metal plate 3 is larger than 1.0 indicates that the volume of the rear metal plate 4 is large. Increasing the volume of the rear metal plate 4 makes it possible to easily reduce the warpage amount of the ceramic substrate 2 even when the protrusion 51 is provided on the front metal plate 3.

One or plural protrusions 5 are provided on the front metal plate 3. The protrusion 5 exhibits a structure with the external terminal 51 joined thereto or a structure with the protrusion 52 provided on the metal plate. The external terminal is provided in order to achieve continuity with the outside. Examples of the shape of the external terminal include various shapes such as a lead frame shape and a lead pin shape. That is, the protrusion 5 may be a part of the metal plate, a part of the lead frame, or a part of the lead pin. Examples of a method to join the external terminal and the front metal plate 3 include a method to join them with a joining layer such as solder or a brazing material interposed therebetween and a method to directly join them such as ultrasonic joining and press joining. Examples of the structure with the protrusion provided on the metal plate include one in which the metal plate itself is worked into a projecting shape in cross section and one in which the protrusion is joined. Examples of a method to join the protrusion include a method to join it with a joining layer such as solder or a brazing material interposed therebetween and a method to directly join it such as ultrasonic joining and press joining. The protrusion provided on the front metal plate 3 is used as a pedestal portion on which a semiconductor element is to be mounted. That is, the semiconductor element is mounted on a first metal part. Therefore, the external terminal and the protrusion provided on the front metal plate 3 (pedestal portion) are distinguished.

The thickness of the external terminal is preferred to be 0.2 mm or more. When the external terminal has a flat plate shape such as a lead frame shape, the plate thickness of a flat plate becomes the thickness of the external terminal. When the external terminal has a columnar shape such as a lead pin shape, the diameter becomes the thickness of the external terminal. Setting the thickness of the external terminal to 0.2 mm or more or further 0.4 mm or more makes it possible to increase the ampacity. The increase in ampacity makes it possible to make good use of properties of the high-performance semiconductor element.

The thickness of the pedestal portion (protrusion provided on the front metal plate 3) is preferred to be 0.2 mm or more. The pedestal portion is used as a place where a semiconductor element is to be mounted. The place where a semiconductor element is to be mounted is formed of a thick metal plate, thereby making it possible to improve the heat dissipation property. The protrusion made of the external terminal or the pedestal portion is set to be provided at an arbitrary place on the front metal plate 3. How many protrusions are to be provided is also arbitrary.

In the case where the ceramic substrate 2 is equally divided into a first section (left side), a second section (center side), and a third section (right side) along the longer side direction, the first metal part including the protrusion and the front metal plate 3 has a first region overlapping the first section, a second region overlapping the second section, and a third region overlapping the third section. A second metal part including the rear metal plate 4 has a fourth region overlapping the first section, a fifth region overlapping the second section, and a sixth region overlapping the third section.

A volume $V_1$ of the first region, a volume $V_2$ of the second region, a volume $V_3$ of the third region, a volume $V_4$ of the fourth region, a volume $V_5$ of the fifth region, and a volume $V_6$ of the sixth region are preferred to be numbers satisfying $V_4/V_1+V_6/V_3 \leq 2(V_5/V_2)$, $0.5 \leq V_4/V_1 \leq 2$, $0.5 \leq V_5/V_2 \leq 2$, and $0.5 \leq V_6/V_3 \leq 2$.

Satisfying $0.5 \leq V_4/V_1 \leq 2$, $0.5 \leq V_5/V_2 \leq 2$, and $0.5 \leq V_6/V_3 \leq 2$ indicates that the ratio of the volumes of the metal plates in each two facing regions is within a predetermined range. Deviation from this range indicates that the volume of the front-surface side metal plate or the rear-surface side metal plate is too large. Thereby, the warpage amount of the ceramic substrate increases to cause a decrease in TCT characteristics. In the case where the protrusion is provided on the front metal plate 3, the protrusion is included in the volume $V_1$ to the volume $V_3$. In the case where the lead frame type external terminals each protrude from the longer side of the ceramic substrate as illustrated in FIG. 2, the protruding portions are not counted in $V_1$ and $V_3$.

$V_4/V_1$ preferably falls within a range of 0.8 to 1.7. Similarly, $V_5/V_2$ and $V_6/V_3$ each also preferably fall within a range of 0.8 to 1.7. The volume ratios are each adjusted to a predetermined range in spite of the protrusion being provided on the front metal plate 3.

$V_1$ to $V_6$ further preferably satisfy $V_4/V_1+V_6/V_3 \leq 2(V_5/V_2)$. The above indicates that the total of $(V_4/V_1)$ and $(V_6/V_3)$ is smaller than the double of $(V_5/V_2)$ when the ceramic substrate 2 is equally divided into three parts along the longer side direction. This indicates that $V_4/V_1 \leq V_5/V_2$ and $V_6/V_3 \leq V_5/V_2$ are established substantially.

The warpage amount of the ceramic circuit board 1 is affected by the difference in linear expansivity between the ceramic substrate 2 and the metal plate. The linear expansion coefficient of a silicon nitride substrate (room temperature) is 2 to $3 \times 10^{-6}$/K. K represents Kelvin. Copper is $0.162 \times 10^{-4}$/K and Al is $0.237 \times 10^{-4}$/K. There is a three-digit difference in linear expansion coefficient between a silicon nitride substrate and a copper plate or an Al plate. The metal plate is thermally deformed by heat generated when the ceramic substrate 2 and the metal plate are heat-joined. By this thermal deformation, the ceramic substrate 2 curves to cause warpage. As the volume of the metal plate increases, the absolute amount of the thermal deformation increases. When the absolute amount of the thermal deformation increases, the warpage amount of the ceramic substrate 2 increases. The increase in warpage amount of the ceramic substrate 2 causes poor mounting on a heat dissipation member or a decrease in TCT characteristics.

Performing a warp correction process is considered when the warpage amount is large. The warp correction process is a process to sandwich the ceramic circuit board between flat plates to be hot-pressed. Such a structure having the protrusion (the external terminal, the pedestal portion) as the ceramic circuit board according to the embodiment fails to perform sandwiching between flat plates, and thus it is difficult to perform the warp correction process. In the ceramic circuit board according to the embodiment, "$V_4/V_1+V_6/V_3 \leq 2(V_5/V_2)$" and "$0.5 \leq V_4/V_1 \leq 2$, $0.5 \leq V_5/V_2 \leq 2$, and $0.5 \leq V_6/V_3 \leq 2$" are established. This enables the warpage amount of the longer side and the warpage amount of the shorter side of the ceramic substrate 2 to be less than 0.1 mm (including zero) in spite of the structure having the protrusion (the external terminal, the pedestal portion). The warpage amount can be less than 0.1 mm (including zero) unless the warp correction process is performed after the protrusion structure is provided.

Figure 5:
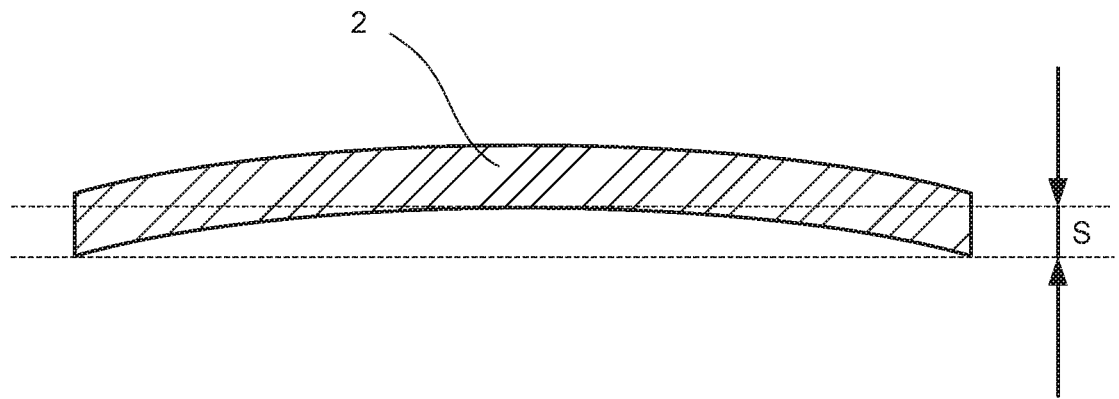
FIG. 5 is a view illustrating a warpage amount of a ceramic substrate as an example.
Figure 6:
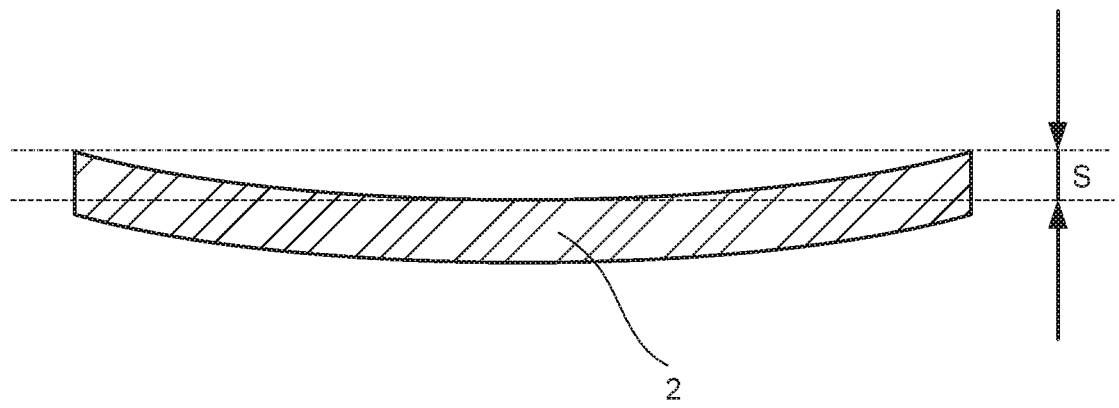
FIG. 6 is a view illustrating the warpage amount of the ceramic substrate as an example.

FIG. 5 and FIG. 6 are views each illustrating the warpage amount of the ceramic circuit board as an example. FIG. 5 and FIG. 6 each illustrate the ceramic substrate 2 and a warpage amount S. In FIG. 5 and FIG. 6, illustrations of the front metal plate 3, the rear metal plate 4, and the protrusion are omitted. In FIG. 5, the ceramic substrate 2 warps convexly to the front metal plate 3 side, and in FIG. 6, the ceramic substrate 2 warps convexly to the rear metal plate 4 side. As illustrated in FIG. 5, in the case where the ceramic substrate 2 warps convexly to the front metal plate 3 side, the farthest distance between a straight line connecting edges of the ceramic substrate 2 and the rear surface of the ceramic substrate 2 is set as the warpage amount. As illustrated in FIG. 6, in the case where the ceramic substrate 2 warps convexly to the rear metal plate 4 side, the farthest distance between a straight line connecting edges of the ceramic substrate 2 and the front surface of the ceramic substrate is set as the warpage amount.

In the ceramic circuit board 1 according to the embodiment, the warpage amount of the longer side and the warpage amount of the shorter side are both preferred to be less than 0.1 mm or further 0.01 mm or less (including zero). The warpage amount of the ceramic circuit board 1 is reduced on the condition of having the protrusion (the external terminal, the pedestal portion), thereby enabling easy mounting on the heat dissipation member.

The longer side length and the shorter side length of the ceramic substrate 2 each preferably fall within a range of 10 mm to 200 mm. The case of the longer side length and the shorter side length each being less than 10 mm enables joining of only a small metal plate, and thus there is a risk that it becomes impossible to sufficiently secure a space for joining the external terminal or the like. When the length is large in excess of 200 mm, it becomes difficult to control the warpage amount.

Figure 7:
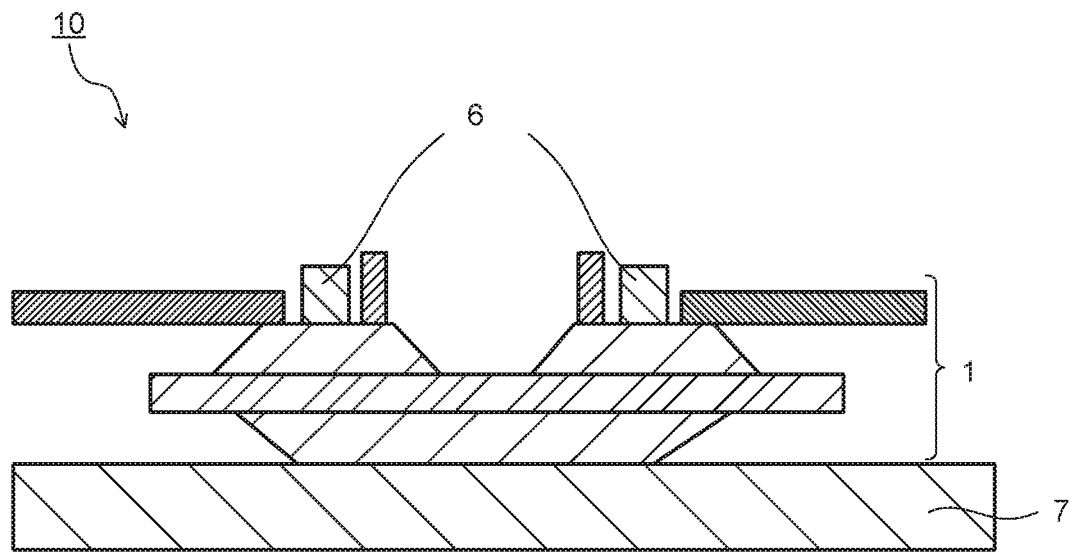
FIG. 7 is a view illustrating one example of a semiconductor module.

FIG. 7 illustrates one example of a semiconductor module. FIG. 7 illustrates a semiconductor module 10, the ceramic circuit board 1, semiconductor elements 6, and a heat dissipation member 7. The semiconductor module 10 includes the semiconductor elements 6 mounted on the front metal plates 3. In FIG. 7, the two semiconductor elements 6 are mounted, but the number of semiconductor elements 6 to be mounted is not limited in particular as long as it is one or more. The rear metal plate 4 is mounted on the heat dissipation member 7. In FIG. 7, the heat dissipation member 7 is a plate-shaped heat sink, but may have various shapes such as a comb shape, a groove shape, and a pin shape. The ceramic circuit board 1 can be mounted on the heat dissipation member 7.

Between the rear metal plate 4 and the heat dissipation member 7, an inclusion such as grease, solder, a brazing material, or an adhesive is preferably interposed. When the ceramic circuit board 1 is mounted on the heat dissipation member 7, the ceramic circuit board 1 is preferably fixed by a method to apply a stress such as screwing. As a fixing method to apply a stress, a method to provide holes for screwing in the ceramic substrate 2 and perform screwing can be cited. A method to sandwich the ceramic substrate 2 between fixing jigs and screw the fixing jigs can also be cited.

If there are gaps between the rear metal plate 4 of the ceramic circuit board 1 and the heat dissipation member 7, it is difficult to dissipate the heat of the semiconductor element 6 to the heat dissipation member 7. Even in the case where gaps (air bubbles) are formed in an inclusion (for example, a grease layer) between the rear metal plate 4 and the heat dissipation member 7, it becomes difficult to dissipate the heat of the semiconductor element 6 to the heat dissipation member 7. Therefore, increasing adhesiveness between the rear metal plate 4 and the heat dissipation member 7 is required. Since the warpage amount has been reduced in the ceramic circuit board according to the embodiment, the adhesiveness to the rear metal plate 4 can be increased when mounting on the heat dissipation member 7. This makes it possible to reduce the gaps in the inclusion. Even when a fixing structure to apply a stress to the ceramic circuit board 1 is provided, the adhesiveness between the rear metal plate 4 and the heat dissipation member 7 does not decrease. When the fixing structure is provided with an inclusion interposed therebetween, the ceramic substrate 2 is preferred to have a shape warped convexly to the rear surface side. When both sides of the ceramic circuit board are screwed in a structure warped convexly to the rear surface side as illustrated in FIG. 6, fixing can be achieved while the inclusion between the rear metal plate 4 and the heat dissipation member spreading out from the center. The inclusion such as grease spreads out, thereby making it possible to prevent air bubbles from being formed in an inclusion layer.

The warpage amount has been reduced even in the case where the ceramic substrate 2 warps convexly to the front surface side as illustrated in FIG. 5, so that it is possible to prevent a lot of air bubbles from being formed in the inclusion layer. When a conductive inclusion such as solder is used, a screwing stress makes it possible to prevent the solder from protruding more than necessary. In the case of an inclusion to melt by heat such as solder or a brazing material, the structure warped convexly to the front surface side is preferred.

In other words, in the case of a structure in which no inclusion is provided between the rear metal plate 4 and the heat dissipation member 7 or a structure in which an insulating inclusion is interposed therebetween, the structure warped convexly to the rear surface side is preferred. In the case of a structure with interposition of a conductive inclusion, the structure warped convexly to the front surface side is preferred.

According to the above-described ceramic circuit board 1, the warpage amount is small in spite of the protrusion being provided on the front metal plate 3. It is also possible to improve the TCT characteristics.

Figure 8:
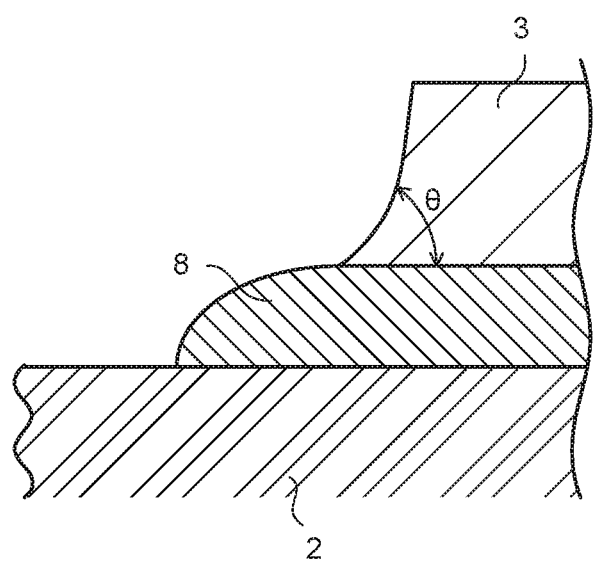
FIG. 8 is a view illustrating a contact angle between a joining layer protruding portion and a side surface of the metal plate as an example.

Protruding a joining layer to join the ceramic substrate 2 and the metal plate and working a side surface of the metal plate into an inclined structure are also effective in the improvement in TCT characteristics. FIG. 8 is a view illustrating a joining side surface of the ceramic substrate 2 and the metal plate as an example. FIG. 8 illustrates the ceramic substrate 2, the front metal plate 3, a joining layer 8, and a contact angle θ between the joining layer and the metal plate. In FIG. 8, the front metal plate 3 is illustrated as an example, but the rear metal plate 4 also preferably has the same structure.

The ceramic circuit board according to the embodiment may have either a joining structure in which the ceramic substrate and the metal plate are joined with the joining layer interposed therebetween or a joining structure in which the ceramic substrate and the metal plate are joined directly without the joining layer interposed therebetween. Controlling such a volume ratio of the rear metal plate to the front metal plate as above enables control of the warpage amount. On the other hand, the joining structure in which they are joined with the joining layer interposed therebetween is preferred in order to further improve the TCT characteristics. The joining layer functions as a mitigation layer for a heat stress between the ceramic substrate and the metal plate. In order to improve the effect of mitigating the heat stress, it is preferred to include a structure in which the joining layer is protruded from an end portion of the metal plate. When the heat stress is applied, the stress of the portion of the end portion of the metal plate and the ceramic substrate increases. Providing a joining layer protruding portion makes it possible to mitigate the stress. A protruding amount of the joining layer protruding portion preferably falls within a range of 10 μm to 100 μm.

The joining layer preferably contains at least one element selected from Ag (silver), Cu (copper), and Al (aluminum) as a main component. The joining layer preferably contains at least one active metal selected from Ti (titanium), Zr (zirconium), Hf (hafnium), Si (silicon), and Mg (magnesium). The combination of these makes it possible to obtain the effect of mitigating the heat stress.

Examples of the joining layer include a joining layer containing Ag and Cu and at least one element selected from Ti, Zr, and Hf. Further, a joining layer containing Al and one or two selected from Si and Mg is cited. Among them, the joining layer containing Ag or Cu as the main component is preferred. The joining layer containing Ag or Cu as the main component is effective in joining a copper plate. The copper plate is effective in improving the heat dissipation property because the heat conductivity is higher as compared to an Al plate. Setting the thickness of the copper plate to 0.6 mm or more makes it possible to diffuse the heat not only in a chip direct downward direction but also in a surface direction, enabling an improvement in the heat dissipation property.

In order to form the joining layer containing Ag and Cu and one or two or more selected from Ti, Zr, and Hf, using a brazing material containing these components is preferred. Ti is preferred among the active metals selected from Ti, Zr, and Hf. When using the silicon nitride substrate as the ceramic substrate, Ti forms TiN, enabling achievement of strong joining. It is also effective to add at least one element selected from In (indium), Sn (tin), and C (carbon) to the brazing material.

In the case of a brazing material composed of Ag, Cu, and Ti, preferably, Ag falls within a range of 40 to 80 mass %, Cu falls within a range of 15 to 45 mass %, Ti falls within a range of 1 to 12 mass %, and Ag+Cu+Ti=100 mass % is established. In the case of adding In, Sn, one or two of In and Sn preferably fall within a range of 5 to 20 mass %. In the case of adding C, it preferably falls within a range of 0.1 to 2 mass %. In the case of a brazing material being composed of five types of Ag, Cu, Ti, Sn (or In), and C, preferably, Ag is adjusted to a range of 40 to 80 mass %, Cu is adjusted to a range of 15 to 45 mass %, Ti is adjusted to a range of 1 to 12 mass %, Sn (or In) is adjusted to a range of 5 to 20 mass %, C is adjusted to a range of 0.1 to 2 mass %, and Ag+Cu+Ti+Sn (or In)+C=100 mass % is established.

The contact angle θ between the joining layer and the metal plate is preferred to be 80 degrees or less or further 60 degrees or less. The side surface of the metal plate is formed into the inclined structure, thereby making it possible to reduce the stresses generated in the ceramic substrate and the end portion of the metal plate.

The contact angle θ is found from an observation image (enlarged photograph) obtained by observing the cross section of the ceramic circuit board by a scanning electron microscope (SEM). The contact angle θ is an angle of the portion in contact with the joining layer protruding portion. As illustrated in FIG. 8, the entire side surface of the metal plate does not need to have the same the contact angle θ. The angle between the joining layer protruding portion and the contact portion of the side surface of the metal plate is preferably set to 80 degrees or less. Therefore, the angle of an upper portion of the side surface of the metal plate (an angle between an upper surface and the side surface of the metal plate) may exceed 80 degrees. In the case where the thickness of the metal plate is as thick as 0.6 mm or more, the angle θ of the contact portion is preferred to be 80 degrees or less and the angle of the upper portion of the side surface of the metal plate is preferred to be an angle in excess of 80 degrees. The angle of a cross section of the upper portion of the side surface of the metal plate is preferred to be close to a right angle like 85 to 95 degrees. The angle of the cross section of the upper portion of the side surface of the metal plate is close to the right angle, thereby making it easier to secure an area where the external terminal and the semiconductor element are to be mounted.

In the ceramic circuit board including the above-described structure, controlling the thicknesses and the volume ratio of the front and rear metal plates makes it possible to reduce the warpage amount of the ceramic substrate in spite of the structure having the protrusion (the external terminal, the pedestal portion) on the front metal plate. By controlling the volume ratio of the front and rear metal plates, homogenization of the heat stress is achieved, and thereby the TCT characteristics also improve.

Thermal resistance (Rth) is found by Expression: $Rth=H/(k\times A)$. H represents a heat transfer path, k represents a heat conductivity, and A represents a heat dissipated area. In order to reduce the thermal resistance (Rth), shortening the heat transfer path (H), increasing the heat conductivity (k), and increasing the heat dissipated area (A) can be cited. In the ceramic circuit board according to the embodiment, thinning the ceramic substrate makes it possible to shorten the heat transfer path of a portion with a low heat conductivity. Thickening the metal plate or providing the protrusion (the external terminal, the pedestal portion) makes it possible to increase the heat conductivity (k) and the heat dissipated area (A) of the ceramic circuit board. As a result, the thermal resistance (Rth) can be reduced.

In the ceramic circuit board according to the embodiment, the protrusion is provided on the front metal plate, and then the volume ratio of the front and rear metal plates is controlled. Providing the protrusion on the front metal plate side makes it possible to achieve an increase in the ampacity and an improvement in the heat dissipation property. Further, in spite of having the three-dimensional protrusion on the front metal plate side, the warpage amount of the ceramic substrate has been reduced. This makes it possible to reduce defects in a mounting process.

The ceramic circuit board as above is suitable for the semiconductor module. The semiconductor module has the semiconductor element mounted on the front metal plate. The rear metal plate is mounted on the heat dissipation member. The semiconductor module has a fixing structure such as screwing or a resin sealing structure as necessary.

Between the rear metal plate and the heat dissipation member, the inclusion layer (grease, solder, or the like) is provided as necessary. A transfer molding method is preferably applied to the resin sealing. The transfer molding method is a resin sealing method excellent in mass productivity because the method makes it possible to perform a molding process for a plurality of substrates at a time by increasing the size of a metal mold. On the other hand, in the transfer molding method, thin wires are likely to cause deformation or wire breakage. In the ceramic circuit board according to the embodiment, the thickness of the external terminal can be made 0.2 mm or more, thereby making it possible to suppress deformation of the external terminal. In other words, the ceramic circuit board according to the embodiment is suitable for the transfer molding method.

Next, there will be explained an example of a manufacturing method of the ceramic circuit board according to the embodiment. The manufacturing method is not limited in particular, as long as the ceramic circuit board according to the embodiment includes the above-described structure, but the following methods are cited as a method with good yields.

First, the metal plate is joined to both surfaces of the ceramic substrate. As the ceramic substrate, a substrate having a thickness of 0.5 mm or less is prepared. The ceramic substrate is preferred to be a silicon nitride substrate whose thickness is 0.33 mm or less and whose three-point bending strength is 500 MPa or more. The heat conductivity of the silicon nitride substrate is preferred to be 80 W/m·K or more. The silicon nitride substrate has a high strength, thereby making it possible to reduce the warpage amount after joining of the metal plates. The substrate having high heat conductivity and being thin is used, thereby enabling a reduction in thermal resistance.

The metal plate is preferred to be one type selected from copper, aluminum, and their alloy. The thickness of at least one of the front metal plate and the rear metal plate is preferred to be 0.6 mm or more. The metal plate may be worked into a pattern shape beforehand, or may be a solid plate. The solid plate may be worked into a pattern shape by etching after joining. In the case where the pedestal portion is provided on the front metal plate, a metal plate worked into a protrusion shape beforehand may be used.

It is preferred beforehand to join metal plates each having a size larger than 1.0 in the ratio of the total volume of the rear metal plate/the total volume of the front metal plate. In a later-described etching process, the volume ratio of the front and rear metal plates may be controlled.

In a joining process, using an active metal joining method or a direct joining method is preferred. The active metal joining method is a method to use an active metal brazing material. In the case of the metal plate being a copper plate or a copper alloy plate, the active metal preferably contains at least one element selected from Ti (titanium), Zr (zirconium), Hf (Hafnium), and Nb (niobium). As the active metal, Ti is most preferred. Examples of the component other than the active metal include Ag, Cu, In, and Sn. Examples of the active metal brazing material include a brazing material composed of Ag of 40 to 80 mass %, Cu of 20 to 60 mass %, Ti of 0.1 to 12 mass %, Sn of 20 mass % or less (including zero), and In of 20 mass % or less (including zero). In the case of the metal plate being an Al plate or an Al alloy plate, the active metal is Al (aluminum).

Examples of the component other than the active metal include Si (silicon). Examples of the active metal brazing material include a brazing material composed of Si of 0.01 to 10 mass % and the balance being Al.

A resin binder is added to the active metal brazing material to prepare an active metal brazing material paste. The active metal brazing material paste is applied on the silicon nitride substrate to form an active metal brazing material paste layer. The metal plate is arranged thereon. In the case of providing the joining layer protruding portion, the active metal brazing material paste layer is provided to be larger in length and width than the metal plate. The application thickness of the active metal brazing material paste layer preferably falls within a range of 10 to 40 μm. The thickness of the active metal brazing material paste layer being less than 10 μm causes a risk that a sufficient joining strength is not obtained. When the thickness is thick in excess of 40 μm, a further improvement of the joining strength is not achieved, and further the thickness causes an increase in cost. Therefore, the thickness of the active metal brazing material paste layer preferably falls within a range of 10 to 40 μm or further a range of 15 to 25 μm.

Next, a heating process is performed. A heating temperature preferably falls within a range of 600 to 900° C. When the active metal brazing material contains one selected from Ti, Zr, Hf, and Nb, a joining temperature preferably falls within a range of 750 to 900° C. When the active metal brazing material contains Al, the joining temperature preferably falls within a range of 600 to 750° C. The heating process is preferably performed in a vacuum atmosphere. The degree of vacuum is preferred to be $1 \times 10^{-2}$ Pa or less, or further $4 \times 10^{-3}$ Pa or less. Performing the heating process in the vacuum atmosphere makes it possible to prevent the copper plate or the active metal brazing material from being oxidized or nitrided.

The direct joining method is a method of joining without interposition of a joined brazing material layer. In the case of the metal plate being a copper plate, joining is performed by using a eutectic of Cu and oxygen. In the case of the ceramic substrate being a nitride ceramic, an oxide film is preferably provided on the front surface. In the case of the metal plate being an Al plate, using an AlSi alloy plate is preferred.

Next, the joined metal plate is worked into a pattern shape. Working into a pattern shape is preferably performed by etching. The etching enables working a side surface shape of the metal plate into a target shape. Similarly, controlling a condition of the etching makes it possible to control the size of the joining layer protruding portion. The working may be performed by etching so that the ratio of the total volume of the rear metal plate/the total volume of the front metal plate becomes larger than 1.0.

It is preferred to control the warpage amount of the ceramic circuit board after joining of the metal plates. The warpage amounts of the longer side and the shorter side of the ceramic circuit board are each preferably made to fall within a range of 0.01 to 1.0 mm. The warpage amount in a diagonal line direction of the ceramic substrate is preferably made to fall within a range of 0.1 to 1.5 mm. A predetermined warpage amount is imparted to the ceramic circuit board prior to providing the protrusion. This makes it possible to reduce the warpage amount of the ceramic substrate after joining of the protrusion (the external terminal, the pedestal portion).

In order to impart a predetermined warpage amount, the warpage correction process or a warpage imparting process may be performed. The warpage correction process is a process in which the front and rear surfaces are sandwiched between flat-plate jigs to be subjected to a heat treatment while applying a pressing force. The warpage imparting process is a process in which the front and rear surfaces are sandwiched between jigs including a target warpage amount to be subjected to a heat treatment while applying a pressing force. It is a process to perform a heat treatment while applying a pressing force. In the case where the warpage amount of the ceramic circuit board prior to providing the protrusion is large, the warpage correction process is performed, and in the case where the warpage amount is small, the warpage imparting process is performed.

Next, a process to provide the protrusion is performed. The protrusion becomes the external terminal or the pedestal portion. Examples of the external terminal include a lead frame type, a lead pin type, and so on. As the external terminal, using a terminal whose thickness is 0.2 mm or more is preferred. Thickening the external terminal makes it possible to increase the ampacity. Thickening the external terminal makes it also possible to improve the heat dissipation effect.

The lead frame type external terminal has a flat plate shape. The thickness in longer side×shorter side×thickness of a flat plate becomes the thickness of the external terminal. The lead pin type external terminal has a columnar shape. The diameter in height×diameter of a column becomes the thickness of the external terminal. The thickness of the external terminal is preferred to be 0.2 mm or more, or further 0.4 mm or more.

The pedestal portion is provided for mounting the semiconductor element thereon. The pedestal portion has a pillar shape such as a square pillar or a column. The height of the pillar shape becomes the thickness of the external terminal. Providing the pedestal portion facilitates heat dissipation of the semiconductor element.

As the process to join the protrusion (the external terminal, the pedestal portion) and the front metal plate, a method to join them with the joining layer such as solder or a brazing material interposed therebetween is cited. The joining process may be a method to directly join them without the joining layer interposed therebetween such as ultrasonic joining or pressing joining.

The front metal plate to which the protrusion has been joined and the rear metal plate are arranged so as to establish "$V_4/V_1+V_6/V_3 \leq 2(V_5/V_2)$" and "$0.5 \leq V_4/V_1 \leq 2$, $0.5 \leq V_5/V_2 \leq 2$, and $0.5 \leq V_6/V_3 \leq 2$."

Next, there is performed a process to mount the semiconductor element. As the mounting process of the semiconductor element, a joining process using solder or the like is cited. In the case of joining the external terminal, the semiconductor element may be mounted first. By a reflow process, the process to join the external terminal and the process to join the semiconductor element may be performed simultaneously.

Through the above processes, the semiconductor module according to the embodiment can be manufactured. The semiconductor module according to the embodiment is capable of reducing the warpage amount of the ceramic substrate to less than 0.1 mm or further 0.01 mm or less (including zero) in spite of having the protrusion on the front metal plate. This makes it possible to further improve mountability on the heat dissipation member.

EXAMPLES

Examples 1 to 6, Comparative Examples 1 to 2

As the silicon nitride substrate, two types of substrates illustrated in Table 1 were prepared.

TABLE 1

|  | Silicon Nitride Substrate Size (Long Length × Short Length × Thickness) | Heat Conductivity (W/m · K) | Three-Point Bending Strength (MPa) |
|---|---|---|---|
| Silicon Nitride Substrate 1 | 60 mm × 40 mm × 0.32 mm | 90 | 650 |
| Silicon Nitride Substrate 2 | 50 mm × 35 mm × 0.25 mm | 85 | 700 |

Next, copper plates were used to fabricate ceramic circuit boards illustrated in Table 2. Joining between the silicon nitride substrate and the copper plate was performed by an active metal joining method. As the active metal brazing material, a brazing material composed of Ag (55 mass %), Cu (30 mass %), In (10 mass %), and Ti (5 mass %) was prepared. The brazing material was mixed with a resin binder to make an active metal brazing material paste to be applied on the silicon nitride substrate so as to have a thickness of 20 μm. Next, the copper plate was arranged and the heat joining process was performed at 780 to 830° C. in the vacuum atmosphere ($1\times10^{-3}$ Pa or less).

Next, the etching process was performed. The front metal plate was etched into a pattern shape. The side surface of the front metal plate was etched, thereby adjusting the size of the joining layer protruding portion and the contact angle θ between the joining layer protruding portion and the side surface of the metal plate. The side surface of the rear metal plate was etched, thereby adjusting the size of the joining layer protruding portion and the contact angle θ between the joining layer protruding portion and the side surface of the metal plate. The size of the joining layer protruding portion was unified to 20 μm and the contact angle θ between the joining layer protruding portion and the side surface of the metal plate was unified to 60 degrees. The distance between the front metal plates (front copper plates) was unified to 1.2 mm.

TABLE 2

|  | Silicon Nitride Substrate | Front Copper Plate Size (length × width × thickness) | Number | Rear Copper Plate Size (length × width × thickness) | Ratio of Total Volume of Rear Copper Plate/ Total Volume of Front Copper Plate |
|---|---|---|---|---|---|
| Silicon Nitride Circuit Board 1 | Silicon Nitride Substrate 1 | 45 mm × 15 mm × 0.7 mm | 2 | 50 mm × 30 mm × 0.8 mm | 1.3 |
| Silicon Nitride Circuit Board 2 | Silicon Nitride Substrate 2 | 30 mm × 10 mm × 0.8 mm | 2 | 40 mm × 30 mm × 0.9 mm | 2.3 |
| Silicon Nitride Circuit Board 3 | Silicon Nitride Substrate 1 | 47 mm × 18 mm × 0.9 mm | 2 | 50 mm × 30 mm × 0.8 mm | 0.8 |
| Silicon Nitride Circuit Board 4 | Silicon Nitride Substrate 1 | L-Shape Type (20 mm × 30 mm × 0.8 mm and 5 mm × 30 mm × 0.8 mm are integrated) 20 mm × 10 mm × 0.8 mm | 1<br><br><br><br>2 | 50 mm × 30 mm × 0.9 mm | 1.5 |

The ceramic circuit boards according to samples 1 to 3 were used to adjust warpage amounts in the longer side direction, the shorter side direction, and the diagonal line direction. For the adjustment of the warpage amount, the warpage correction process or the warpage imparting process was performed as necessary. Results thereof are illustrated in Table 3.

TABLE 3

|  | Silicon Nitride Circuit Board | Warpage Amount | | | Warpage Direction |
|---|---|---|---|---|---|
|  |  | Longer side (mm) | Shorter side (mm) | Diagonal Line (mm) |  |
| Sample 1 | Silicon Nitride Circuit Board 1 | 0.3 | 0.2 | 1.2 | Convex To Front Surface Side |
| Sample 2 | Silicon Nitride Circuit Board 1 | 0.7 | 0.2 | 1.0 | Convex To Front Surface Side |
| Sample 3 | Silicon Nitride Circuit Board 1 | 0.3 | 0.1 | 0.8 | Convex To Front Surface Side |
| Sample 4 | Silicon Nitride Circuit Board 2 | 0.2 | 0.1 | 0.6 | Convex To Front Surface Side |
| Sample 5 | Silicon Nitride Circuit Board 2 | 0.4 | 0.3 | 1.1 | Convex To Front Surface Side |
| Sample 6 | Silicon Nitride Circuit Board 3 | 0.2 | 0.1 | 0.4 | Convex To Rear Surface Side |
| Sample 7 | Silicon Nitride Circuit Board 1 | — | — | — | No Warpage |
| Sample 8 | Silicon Nitride Circuit Board 4 | 0.5 | 0.2 | 1.1 | Convex To Front Surface Side |

As the protrusion, external terminals or pedestal portions illustrated in Table 4 were prepared. Each protrusion was joined to the front copper plate. Each protrusion was formed of copper.

TABLE 4

| | Type | Size |
|---|---|---|
| Projecting Portion 1 | Lead Frame Type External Terminal | Length 50 mm × Width 6 mm × Thickness 0.5 mm |
| Projecting Portion 2 | Lead Frame Type External Terminal | Length 30 mm × Width 4 mm × Thickness 0.6 mm |
| Projecting Portion 3 | Lead Pin Type External Terminal | Length 2 mm × Diameter 2 mm |
| Projecting Portion 4 | Columnar Type Pedestal Portion | Height 1 mm × Diameter 3 mm |
| Projecting Portion 5 | Lead Frame Type External Terminal | Length 40 mm × Width 10 mm × Thickness 1 mm |

The protrusion was joined to each of silicon nitride circuit boards according to samples 1 to 8. The joining between the protrusion and the front copper plate was performed using the brazing material. Thereby, ceramic circuit boards each having the protrusion on the front metal plate according to Examples 1 to 6 and Comparative examples 1 to 2 were fabricated. The joining was performed so that the volume ratio of the front copper plate and the rear copper plate after joining became the value illustrated in Table 5.

Regarding the volume ratio of the front copper plate and the rear copper plate, the front copper plate and the rear copper plate were each equally divided into three parts along the longer side direction, the volume of a region on the observers' left on the front surface side (including the protrusion) was set to $V_1$, the volume of a center region was set to $V_2$, and the volume of a region on the observers' right was set to $V_3$. Similarly, the volume of a region on the observers' left on the rear surface side (including the protrusion) was set to $V_4$, the volume of a center region was set to $V_5$, and the volume of a region on the observers' right was set to $V_6$. The region having the volume $V_1$ faces the region having the volume $V_4$, the region having the volume $V_2$ faces the region having the volume $V_5$, and the region having the volume $V_3$ faces the region having the volume $V_6$. In the case where the protrusion was provided on the front copper plate, the volume ratio including also the protrusion was set. Results thereof are illustrated in Table 5.

TABLE 5

| | Silicon Nitride Circuit Board | Protrusion | Volume Ratio of Front and Rear Copper Plates | | | |
|---|---|---|---|---|---|---|
| | | | $V_4/V_1$ | $V_5/V_2$ | $V_6/V_3$ | $V_4/V_1 + V_6/V_3 \leq 2(V_5/V_2)$ |
| Example 1 | Sample 1 | Protrusion 1 | 0.94 | 1.14 | 0.94 | ○ |
| Example 2 | Sample 2 | Protrusion 1 Protrusion 3 | 1.09 | 1.14 | 1.09 | ○ |
| Example 3 | Sample 3 | Protrusion 1 Protrusion 4 | 1.03 | 1.11 | 1.03 | ○ |
| Example 4 | Sample 4 | Protrusion 2 | 1.08 | 1.69 | 1.08 | ○ |
| Example 5 | Sample 5 | Protrusion 3 | 1.39 | 1.69 | 1.39 | ○ |
| Example 6 | Sample 6 | Protrusion 2 Protrusion 3 | 1.02 | 1.53 | 1.51 | ○ |
| Comparative Example 1 | Sample 7 | Protrusion 5 | 0.43 | 0.57 | 0.43 | ○ |
| Comparative Example 2 | Sample 8 | Protrusion 2 | 1.16 | 1.14 | 1.16 | x |

Example 1 is an example in which four protrusions 1 (lead frames) were joined. Regarding joining places, the protrusions 1 were joined one by one to the region having the volume $V_1$ and the region having the volume $V_3$ so as not to include the region having the volume $V_2$. Therefore, a structure was made in which the protrusion 1 protruded by 30 mm from the region having the volume $V_1$ (or the region having the volume $V_3$).

Example 2 is an example in which two protrusions 1 (lead frames) and two protrusions 3 (pins) were joined. Each of them was joined so as not to include the region having the volume $V_2$. The protrusions 1 were joined to one front copper plate and the protrusions 3 were joined to the other front copper plate. A structure was made in which the protrusion 1 protruded by 30 mm from the region having the volume $V_1$ (or the region having the volume $V_3$).

Example 3 is an example in which four protrusions 1 (lead frames) were joined and six protrusions 4 (columnar pedestals) were provided. Each two of the protrusions 1 were provided symmetrically so as to overlap in a range of the edge of the front copper plate to 5 mm. Therefore, the protrusions 1 were not provided in the region having the volume $V_2$. Therefore, a structure was made in which the protrusion 1 protruded by 37.5 mm from the region having the volume $V_1$ (or the region having the volume $V_3$). The protrusion 4 (disk-shaped pedestal) is an example in which a disk-shaped pedestal was provided on the front copper plate by presswork. On the single front copper plate, the protrusions 4, three in total, were provided one by one in the region having the volume $V_1$, the region having the volume $V_2$, and the region having the volume $V_3$. In Example 3, such protrusions 1 and protrusions 4 were arranged on the two front copper plates in the same manner.

In Example 4, four protrusions 2 (lead frames) were joined. The protrusions 2 were joined to the front copper plate so as to overlap by 6 mm. Regarding joining places, the protrusions 2 were joined one by one to the region having the volume $V_1$ and the region having the volume $V_3$ so as not to include the region having the volume $V_2$. Therefore, a structure was made in which the protrusion 1 protruded by 14 mm from the region having the volume $V_1$ (or the region having the volume $V_3$).

Example 5 is an example in which four protrusions 3 (lead pin type external terminals) were joined. The protrusions 3 were joined one by one to the region having the volume $V_1$ and the region having the volume $V_3$ (two were joined to the single front copper plate).

Figure 9:
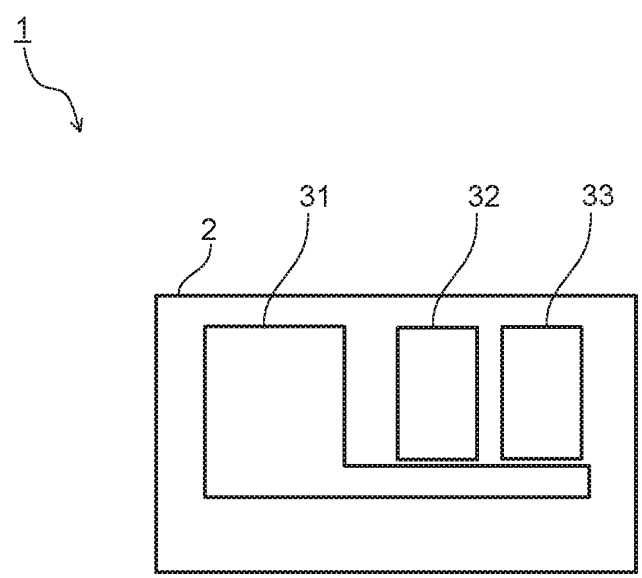
FIG. 9 is a view illustrating arrangement positions of front copper plates.

Example 6 is an example in which the front copper plates were arranged at such positions as illustrated in FIG. 9. FIG. 9 is an example in which an L-shaped copper plate 31 and rectangular copper plates 32 and 33 were joined. The L-shaped copper plate 31 is an example in which a copper plate of 20 mm×30 mm×0.8 mm and a copper plate of 5 mm×30 mm×0.8 mm were integrated. The copper plate 32 and the copper plate 33 each have a size of 20 mm×10 mm×0.8 mm. The three copper plates were arranged 5 mm apart. The protrusions 2 were joined to a region having the volume $V_1$ and a region having the volume $V_3$ of the L-shaped copper plate 31. The protrusions 2 were joined to the copper plate 31 so as to overlap by 10 mm. Example 6 is an example in which each two protrusions 3 (lead pins) (four in total) were joined to the copper plate 32 and the copper plate 33.

Comparative example 1 is an example in which four protrusions 5 (lead frames) were joined. The protrusions 5 were each joined to a place entered the region having the volume $V_2$ by 5 mm. Therefore, a structure was made in which the protrusion 5 protruded by 15 mm from the region having the volume $V_1$ (or the region having the volume $V_3$).

Comparative example 2 is a structure in which four protrusions 2 (lead frames) were joined. The protrusions 2 were joined to the front copper plate so as to overlap by 3.5 mm. Regarding joining places, the protrusions 2 were joined one by one to the region having the volume $V_1$ and the region having the volume $V_3$ so as not to include the region having the volume $V_2$. Therefore, a structure was made in which the protrusion 2 protruded by 20 mm from the region having the volume $V_1$ (or the region having the volume $V_3$).

In Comparative example 1, "$V_4/V_1$" and "$V_6/V_3$" are each out of the range. In Comparative example 2, "$V_4/V_1+V_6/V_3 \leq 2(V_5/V_2)$" is out of the range, In Examples, they are each within the range.

Each warpage amount of the silicon nitride circuit boards having the protrusions according to Examples and Comparative examples was measured. In the measurement of the warpage amount, the warpage amount of the longer side and the warpage amount of the shorter side were measured.

A TCT was performed. In the TCT, −40° C.×30 minutes→room temperature (25° C.)×10 minutes→175° C.×30 minutes→room temperature (25° C.)×10 minutes was one cycle, and the presence or absence of peeling of the metal plate and occurrence of cracking in the silicon nitride substrate after 1000 cycles and after 2000 cycles was measured. Results thereof are illustrated in Table 6.

TABLE 6

| | Warpage Amount | | | Presence or Absence of Defects by TCT | |
|---|---|---|---|---|---|
| | Longer side (mm) | Shorter side (mm) | Warpage Direction | 1000 Cycles | 2000 Cycles |
| Exam 1 | 0.01 | 0.01 | Convex To Rear Surface Side | Absence | Absence |
| Exam 1 | 0.06 | 0.03 | Convex To Rear Surface Side | Absence | Absence |
| Exam 1 | 0.04 | 0.03 | Convex To Rear Surface Side | Absence | Absence |
| Exam 1 | 0.01 | 0.01 | Convex To Rear Surface Side | Absence | Absence |
| Exam 1 | 0.03 | 0.02 | Convex To Rear Surface Side | Absence | Absence |
| Exam 1 | 0.02 | 0.01 | Convex To Rear Surface Side | Absence | Absence |
| Comp. Exam 1 | 0.3 | 0.2 | Convex To Front Surface Side | Absence | Presence |
| Comp. Exam 2 | 0.4 | 0.3 | Convex To Rear Surface Side | Absence | Presence |

As is clear from the table, in each of the silicon nitride circuit boards according to Examples, the warpage amount of the longer side and the warpage amount of the shorter side were each less than 0.1 mm in spite of the structure having the protrusions on the front metal plate. They were each excellent also in TCT characteristics. The examples in which the lead frames (the protrusions 1, the protrusions 2) were provided were excellent in TCT characteristics in spite of the structure in which the lead frame protruded from the silicon nitride substrate. In contrast to this, in both Comparative example 1 and Comparative example 2, the warpage amount increased. After 2000 cycles of the TCT, the defect occurred. This is because the warpage of the silicon nitride circuit board was large and the heat stress was applied more than necessary.

Since in the silicon nitride circuit boards according to Example, the warpage amount was small, poor mounting did not occur when the silicon nitride circuit board was fixed to the heat dissipation member using the screwing structure. The silicon nitride circuit board warps convexly to the rear surface side, to thereby suppress occurrence of air bubbles in grease between the rear copper plate and the heat dissipation member. In contrast to this, since in Comparative examples, the warpage amount was large, the gap between the rear copper plate and the heat dissipation member increased, leading to a decrease in heat dissipation property in the case of having the screwing structure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A circuit board comprising:
   a ceramic substrate with a thickness of 0.5 mm or less including a first surface and a second surface and;
   a first metal part including a first metal plate joined to the first surface and a protrusion projecting from the first metal plate; and
   a second metal part including a second metal plate joined to the second surface, wherein
   the thickness of at least one plate selected from the group consisting of the first and second metal plates is 0.6 mm or more,
   a ratio of the total volume of the second metal plate to the total volume of the first metal plate is larger than 1.0,
   if the ceramic substrate is equally divided into first to third sections along a longer side direction thereof,
   the first metal part has a first region overlapping the first section, a second region overlapping the second section, and a third region overlapping the third section,
   the second metal part has a fourth region overlapping the first section, a fifth region overlapping the second section, and a sixth region overlapping the third section, and
   a volume V1 of the first region, a volume V2 of the second region, a volume V3 of the third region, a volume V4 of the fourth region, a volume V5 of the fifth region, and a volume V6 of the sixth region are numbers satisfying $V_4/V_1+V_6/V_3 \leq 2(V_5/V_2)$, $0.5 \leq V_4/V_1 \leq 2$, $0.5 \leq V_5/V_2 \leq 2$, and $0.5 \leq V_6/V_3 \leq 2$, and                                formula when the protrusion comprises an external protrusion that includes a protruding portion that protrudes beyond a longer side of the ceramic substrate, the volume of the protruding portion that protrudes beyond the longer side of the substrate is excluded from the volumes V1 and V3.

2. The circuit board according to claim 1, wherein the protrusion is a part of the first metal plate, a part of a lead frame, or a part of a lead pin.

3. The circuit board according to claim 1, wherein each of the first and second metal plate is a copper plate with a thickness of 0.6 mm or more.

4. The circuit board according to claim 1, wherein the ceramic substrate is a silicon nitride substrate with a thickness of 0.33 mm or less and a three-point bending strength of 500 MPa or more.

5. The circuit board according to claim 1, wherein the length in the longer side direction and the length in a shorter side direction of the ceramic substrate are each 10 mm or more and 200 mm or less.

6. The circuit board according to claim 1, wherein a warpage amount in the longer side direction and a warpage amount in a shorter side direction of the ceramic substrate are each less than 0.1 mm.

7. The circuit board according to claim 1, wherein at least one side selected from the group consisting of a side of the first metal plate and a side of the second metal plates is inclined.

8. The circuit board according to claim 1, wherein at least one plate selected from the group consisting of the first and second metal plates is joined to the ceramic substrate with a joining layer therebetween, and the joining layer contains Ag, Cu, and at least one element selected from Ti, Zr, and Hf.

9. The circuit board according to claim 1, wherein the ceramic substrate is a silicon nitride substrate with a thickness of 0.33 mm or less and a three-point bending strength of 500 MPa or more, and at least one plate selected from the group consisting of the first and second metal plates is joined to the ceramic substrate with a joining layer therebetween, and the joining layer contains Ag, Cu, and at least one element selected from Ti, Zr, and Hf.

10. A semiconductor module comprising:
the circuit board according to claim 1; and
a semiconductor element on the first metal part.

11. The semiconductor module according to claim 10, further comprising:
a heat dissipation member for mounting the circuit board thereon.

12. The semiconductor module according to claim 10, wherein
the ceramic substrate is a silicon nitride substrate with a thickness of 0.33 mm or less and a three-point bending strength of 500 MPa or more, and
at least one plate selected from the group consisting of the first and second metal plates is joined to the ceramic substrate with a joining layer therebetween, and
the joining layer contains Ag, Cu, and at least one element selected from Ti, Zr, and Hf.

* * * * *